US008259265B2

(12) United States Patent
Chung et al.

(10) Patent No.: US 8,259,265 B2
(45) Date of Patent: Sep. 4, 2012

(54) LIQUID CRYSTAL DISPLAY PANEL, LIQUID CRYSTAL DISPLAY APPARATUS AND MANUFACTURING METHOD THEREOF

(75) Inventors: Te-Chen Chung, Kushan (CN); Chia-Ta Liao, Kushan (CN)

(73) Assignee: Infovision Optoelectronics (Kunshan) Co., Ltd., Kunshan (CN)

( * ) Notice: Subject to any disclaimer, the term of this patent is extended or adjusted under 35 U.S.C. 154(b) by 623 days.

(21) Appl. No.: 12/470,833

(22) Filed: May 22, 2009

(65) Prior Publication Data

US 2010/0245741 A1  Sep. 30, 2010

(30) Foreign Application Priority Data

Mar. 30, 2009 (CN) .......................... 2009 1 0132656

(51) Int. Cl.
  *G02F 1/133* (2006.01)
(52) U.S. Cl. ............................ 349/116; 349/113; 257/59
(58) Field of Classification Search .................. 349/113, 349/116
See application file for complete search history.

(56) References Cited

U.S. PATENT DOCUMENTS

| 6,323,923 | B1* | 11/2001 | Hoshino et al. | 349/113 |
| 6,452,088 | B1* | 9/2002 | Schmidt | 136/244 |
| 2008/0178794 | A1 | 7/2008 | Cho et al. | |
| 2009/0185120 | A1* | 7/2009 | Yoon et al. | 349/116 |

FOREIGN PATENT DOCUMENTS

| CN | 1550848 | 12/2004 |
| CN | 101231944 A | 7/2008 |

\* cited by examiner

*Primary Examiner* — Hemang Sanghavi
(74) *Attorney, Agent, or Firm* — Marshall, Gerstein & Borun LLP

(57) ABSTRACT

The invention provides a liquid crystal display panel, a liquid crystal display apparatus and a method for manufacturing the liquid crystal display panel. The liquid crystal display panel includes a first substrate and a second substrate which are opposite to each other and a liquid crystal layer between the two substrates. On one side of the first substrate which is opposite to the second substrate, there is a solar battery unit and a Thin Film Transistor; and the solar battery unit includes a first electrode layer, a photoelectric conversion layer and a second electrode layer which are sequentially disposed in stack. In the invention, the solar battery is configured between the two substrates, and therefore the size of the panel is not increased and the structure is simple.

15 Claims, 10 Drawing Sheets

LIQUID CRYSTAL DISPLAY PANEL, LIQUID CRYSTAL DISPLAY APPARATUS AND MANUFACTURING METHOD THEREOF

CROSS-REFERENCE TO RELATED APPLICATION

This application claims priority to and expressly incorporates by reference Chinese patent application No. 200910132656.8 filed Mar. 30, 2009.

FIELD OF THE INVENTION

The invention relates to the field of liquid crystal display, and more particularly, to a liquid crystal display panel, a liquid crystal display apparatus and a manufacturing method thereof.

BACKGROUND OF THE INVENTION

A Liquid Crystal Display (LCD) apparatus has many advantages such as being light and thin, energy saving and radiationless. Therefore, LCDs have gradually replaced conventional Cathode-Ray Tube (CRT) displays. Currently, the LCD apparatus is widely applied to electronic apparatuses such as High-definition digital TVs, desktop computers, Personal Digital Assistants (PDA), portable computers, mobile telephones and digital cameras.

FIG. 1 is an equivalent circuit of a conventional liquid crystal display apparatus. As shown in FIG. 1, the conventional liquid crystal display apparatus includes a liquid crystal display panel 1 and a peripheral circuit 2. The peripheral circuit 2 is connected with the electrodes of the liquid crystal display panel 1 via wires for providing the liquid crystal display panel 1 with a power supply and driving signals, and controlling the liquid crystal display panel 1 to display.

The liquid crystal display apparatus may be divided into three basic types according to the reflective modes of the liquid crystal display panels, i.e. a transmissive LCD, a reflective LCD and a transflective LCD. The transmissive LCD has a liquid crystal display panel with a back light source and the back light transmits the panel, and therefore can maintain a good display in normal or dark light. However, the transmissive LCD has large power consumption. The reflective LCD does not have a back light source and can utilize ambient light, and therefore provides a power saving. However, the reflective LCD has such a strong dependence on the ambient light that a good display can only be achieved with sufficient ambient light, otherwise the result may be a hard to recognize display with insufficient ambient light. The transflective LCD integrates both advantages of the transmissive LCD and the reflective LCD.

In the liquid crystal display apparatus, both the driving circuits and the back light source need power supplies such as batteries. Along with a huge demand for environment protection and regeneration clean energy in many nations, solar batteries are applied to the liquid crystal display apparatus more and more widely. Among various solar batteries, an amorphous silicon (a-Si) thin film solar battery is applied widely because of low cost and convenience for large-scale production.

In a conventional LCD, the solar batteries are usually configured on the peripheral side deviating from the liquid crystal layer of the liquid crystal display panel or in the LCD module outside the panel. As a result, the size of the liquid crystal display apparatus is increased.

SUMMARY OF THE INVENTION

The invention provides a liquid crystal display panel, a manufacturing method thereof and a liquid crystal display apparatus, without increasing the size of the liquid crystal display panel due to configuring a solar battery in the liquid crystal display panel.

The invention provides a liquid crystal display panel, including a first substrate and a second substrate which are opposite to each other and a liquid crystal layer between the first and second substrates;

wherein the first substrate includes at least two gate lines and at least two data lines; the at least two gate lines intersect with the at least two data lines respectively to form pixel regions, and each of the pixel regions has a Thin Film Transistor; and wherein at least one of the pixel regions has a solar battery unit and the solar battery unit includes a first electrode layer, a photoelectric conversion layer and a second electrode layer which overlap sequentially from a surface of the first substrate.

The invention also provides a liquid crystal display apparatus, including opposite first and second substrates and a liquid crystal layer between the first and second substrates;

the first substrate includes a plurality of gate lines and data lines which intersect with each other to define a plurality of pixel regions, each of the pixel regions having a Thin Film Transistor; and at least one of the pixel regions has a solar battery unit, and the solar battery unit comprises a first electrode layer, a photoelectric conversion layer and a second electrode layer which are sequentially disposed in stack.

Correspondingly, the invention further provides a method for manufacturing a liquid crystal display panel, including:

forming a first electrode layer in a first region of a first substrate and forming a p+amorphous Silicon (p+a-Si) film layer on the first electrode layer, wherein the first electrode layer and the p+a-Si film layer are arranged in a comb-like shape;

forming an a-Si film layer on the p+a-Si film layer in the first region, in gaps between the p+a-Si film layers and in a second region of the first substrate, wherein the a-Si film layer covers side walls of the first electrode layer and the p+a-Si film layer, and the a-Si film layer in the first region is disconnected from the a-Si film layer in the second region;

forming an n+a-Si film layer on the a-Si film layer, wherein the p+a-Si film layer, the a-Si film layer and the n+a-Si film layer in the first region form a photoelectric conversion layer;

forming a second metal layer on the n+a-Si film layer, wherein the second metal layer in the first region forms the second electrode layer and the second metal layer in the second region forms a gate electrode;

forming a continuous insulation layer on the second metal layer and in gaps between the second metal layers;

forming a source electrode, a drain electrode and a channel layer intersecting the source electrode and the drain electrode on the insulation layer corresponding to the gate electrode; and arranging a second substrate opposite to the first substrate, and sealing a liquid crystal layer between the first and second substrates.

In the above liquid crystal display panel and the liquid crystal display apparatus, on one side of one substrate which is opposite to the other substrate, there are the solar battery unit and the Thin Film Transistor. The solar battery unit includes the first electrode layer, the photoelectric conversion layer and the second electrode layer which are overlapped sequentially from the surface of the substrate. Compared with the conventional technology, the solar battery is configured between the two substrates, and therefore the size of the panel is not increased, the structure is simple and the energy can be saved. Because the solar battery is configured at the reflective area, the aperture ratio of pixel areas is not affected, and the usage rate of the back lighting source is higher.

In the method for manufacturing the liquid crystal panel, the same layers of the solar battery and the Thin Film Transistor are manufactured together, thereby saving the processes, simplifying the procedure and saving the cost.

BRIEF DESCRIPTION OF THE DRAWINGS

From the detailed description of preferred embodiments, in the accompanying drawings, the above and other objectives, characteristics and advantages of the invention will be clearer. In all the drawings, the same reference sign indicates the same part. Furthermore, the drawings are not scaled in an equal ratio according to the actual size but just for illustrating the main idea of the invention.

DETAILED DESCRIPTION OF THE INVENTION

In order to make the above objectives, characteristics and advantages of the invention clearer, embodiments of the invention will be described hereinafter in detail with reference to the accompanying drawings.

The invention is described in detail in accordance with the drawings. In the detailed description of embodiments of the invention, a cross-section view indicating an apparatus structure may be partially enlarged in a particular scale for description convenience. Moreover, the drawings are just exemplary examples, but not for use in limiting the protection scope of the invention. Additionally, in practical manufacture, the three-dimensional-space size including length, width and depth should be included.

Figure 1:
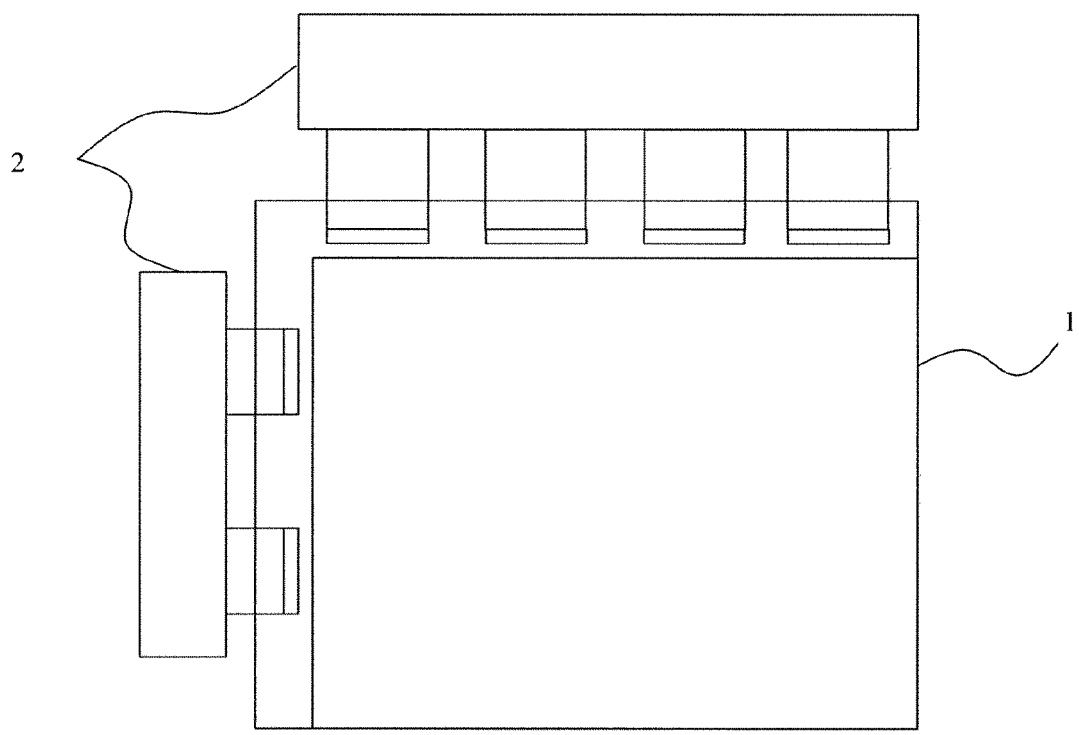
FIG. 1 is an equivalent circuit of a conventional liquid crystal display apparatus.
Figure 2:
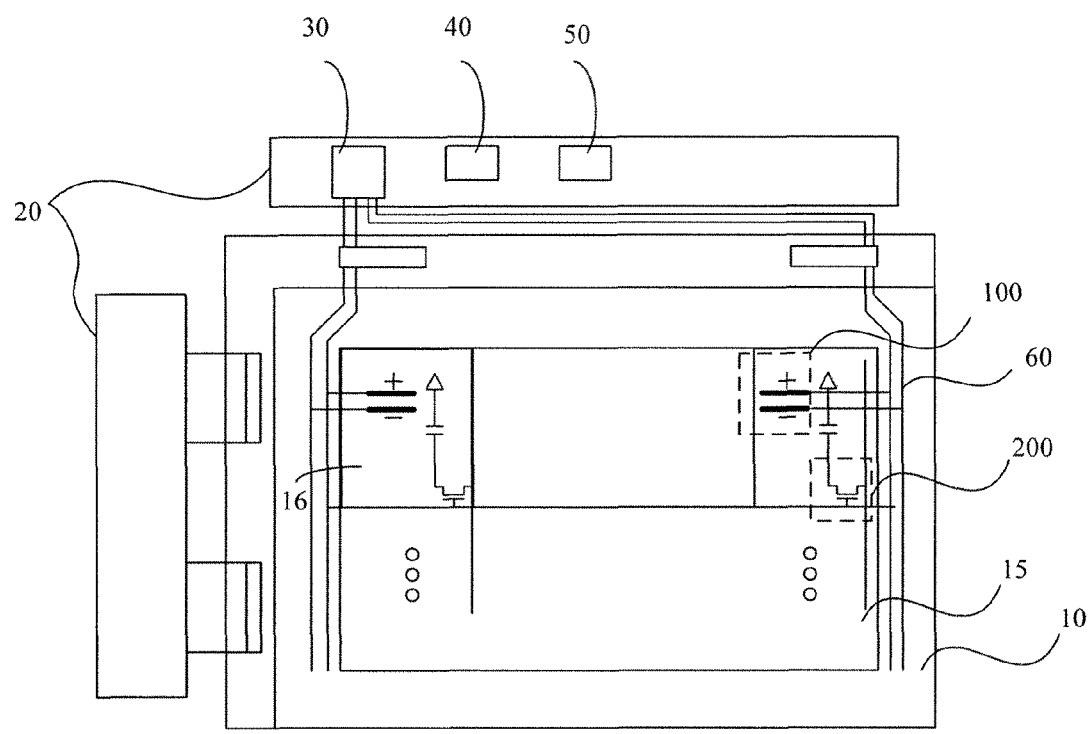
FIG. 2 is an equivalent circuit of a liquid crystal display apparatus according to an embodiment of the invention.
Figure 3:
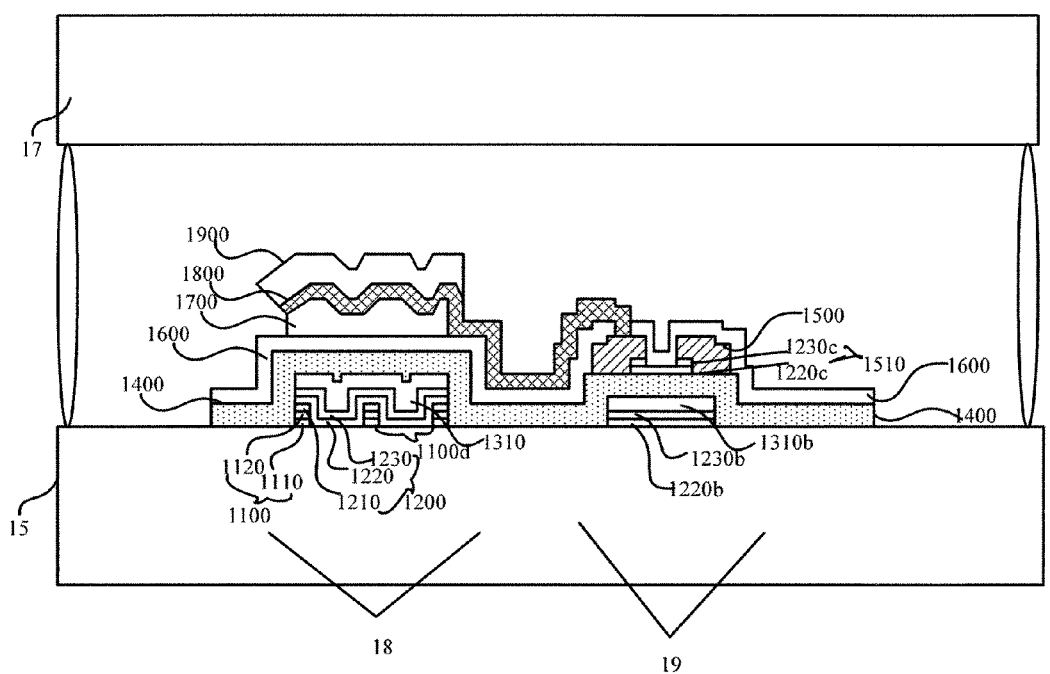
FIG. 3 is an enlarged cross-section view of a pixel region in the liquid crystal display apparatus according to an embodiment of the invention.

Referring to FIGS. 2 and 3, FIG. 2 is an equivalent circuit of a liquid crystal display apparatus according to an embodiment of the invention and FIG. 3 is an enlarged cross-section view of a pixel region in the liquid crystal display apparatus according to the embodiment of the invention.

As shown in FIG. 2, the liquid crystal display apparatus includes a liquid crystal display panel 10 and a peripheral circuit 20 configured to provide power supply for the liquid crystal display panel 10 and control it to display.

The liquid crystal display panel 10 includes two substrates opposite to each other, i.e. a first substrate 15 and a second substrate 17 (shown in FIG. 3), and a liquid crystal layer between the two substrates. On one side of the first substrate 15 which is opposite to the second substrate 17, there is a Thin Film Transistor (TFT) 200 and a solar battery unit 100 formed in film structures. The first substrate 15 may be a glass substrate that has insulation and high transmittance. On the first substrate 15, there is a plurality of data lines, a plurality of gate lines which are arranged across the plurality of data lines, wherein two adjacent data lines and two adjacent gate lines arranged across the two adjacent data lines together define a pixel region 16. Each pixel region 16 includes at least one Thin Film Transistor 200 and at least one solar battery unit 100. The solar battery unit 100 is located in a first region and the Thin Film Transistor 200 is located in a second region of the pixel region 16. Pixel regions 16 in matrix have the same structure, one of which is described in detail hereinafter.

As shown in FIG. 2, in one pixel region 16 of the first substrate 15, there is at least one Thin Film Transistor 200 and at least one solar battery unit 100 on the side facing to the opposite second substrate 17.

As shown in FIG. 3, there is a solar battery unit in the first region 18 of the first substrate 15. The solar battery unit includes a first electrode layer 1100, a photoelectric conversion layer 1200 and a second electrode layer 1310, which overlaps from lower to upper sequentially. For description convenience, the direction close to the first substrate 15 which the solar battery unit is located on is taken as "lower", and the direction close to the second substrate is taken as "upper."

The first electrode layer 1100 includes several discrete laminated structures each of which is formed by a first metal layer 1110 and a first transparent conductive layer 1120. The first transparent conductive layer 1120 covers the upper surface of the first metal layer 1110; and the discrete laminated structures 1100a, 1100b and 1100c (shown in FIGS. 4a and 4b) of the first electrode layer 1100 are arranged in a comb-like shape. There is a slit 1100d between the two adjacent laminated structures. For example, there is a slit 1100d with the width d between 1100a and 1100b, and there also is a similar slit between 1100b and 1100c. Preferably, 0<the width d<300 μm. In other words, the width d between two adjacent laminated structures in a comb-like shape meets a condition: 0<the width d<300 μm.

Certainly, the number of the laminated structures arranged in a comb-like shape shown in FIG. 3 is only used for an example description but is not used for limiting the number of the laminated structures, which may be any numeral that is larger than or equal to two.

The photoelectric conversion layer 1200 is formed by laminated thin films, which include a p+a-Si film layer 1210, an a-Si film layer 1220 and an n+a-Si film layer 1230 that sequentially overlap from lower to upper. The p+a-Si film layer 1210 on the first transparent conductive layer 1120 is arranged in a comb-like shape and covers the upper surface of the first transparent conductive layer 1120.

Certainly, in a liquid crystal display panel according to another embodiment of the invention, the first electrode layer 1100 only includes the first metal layer 1110, i.e., the first transparent conductive layer 1120 may be omitted. The first electrode layer 1100 formed by the first metal layers 1110 is arranged discretely, and the p+a-Si film layer 1210 in the photoelectric conversion layer 1200 of the solar battery unit 100 directly covers the upper surface of the first metal layer 1110. The other structures are the same as the foregoing embodiment and will not be described again.

Specifically, the a-Si film layer 1220 in the first region 18 on the p+a-Si film layer 1210, covers the p+a-Si film layer 1210, side walls of the laminated structures arranged in a comb-like shape of the first electrode layer 1100, and gaps therebetween. Moreover, there is an a-Si film layer 1220b in the second region 19 of the first substrate 15, and the a-Si film layer 1220b in the second region 19 is disconnected from the a-Si film layer 1220 in the first region 18.

The n+a-Si film layer 1230 is on the a-Si film layer 1220 of the first area 18 and covers the upper surface of the a-Si film layer 1220. The upper surface of the a-Si film layer 1220b of the second area 19 is covered with the n+a-Si film layer 1230b.

A second metal layer 1310 on the upper surface of the n+a-Si film layer 1230 in the first region 18 forms the second electrode layer 1310 of the solar battery unit 100. Moreover, the first electrode layer 1100, the photoelectric conversion layer 1200 and the second electrode layer 1310 form the solar battery unit 100. The second metal layer 1310b covering the upper surface of the n+a-Si film layer 1230b in the second region 19 forms a gate line and a gate electrode of the Thin Film Transistor (the gate electrode of the Thin Film Transistor is a part of the gate line).

The transparent conductive layer 1120 may be transparent conductive materials, such as ZnO, $SnO_2$, Indium Tin Oxides (ITO) and so on. In this embodiment shown in FIG. 3, the transparent conductive layer is ITO. The second metal layer 1310 may be a material selected from the group including such as Al, Ag, Cu, Mo or other metal or alloys and AlNd is an example in this embodiment. The a-Si film layer 1220 in the first region 18 and the a-Si film layer 1220b in the second region 19 are the same material, and so are the n+a-Si film layer 1230 in the first region 18 and the n+a-Si film layer 1230b in the second region 19, as well as the second metal layer 1310 in the first region 18 and the second metal layer 1310b in the second region 19.

Furthermore, the first substrate 15 further includes an insulation layer 1400, a passivation layer 1600, an overcoating layer 1700, a second transparent conductive layer 1800 and an Al reflective layer 1900 which overlaps sequentially from lower to upper. In this embodiment, specifically, the insulation layer 1400 on the second metal layer covers the upper surfaces of the second electrode layer 1310 and the gate line 1310b, side walls of the both, the gap therebetween, and parts of the upper surface of the first substrate 15. The insulation layer 1400 may be $SiO_x$ or $SiN_x$. The upper surface of the insulation layer 1400 corresponding to the gate electrode 1310b of the Thin Film Transistor in the second region 19 of the first substrate 15 is covered with the a-Si film layer 1220c, the n+a-Si film layer 1230c and the third metal layer 1500 sequentially form lower and upper. The n+a-Si film layer 1230c partially covers the upper surface of the a-Si film layer 1220c; and the third metal layer 1500 covers the upper surface of the n+a-Si film layer 1230c, the side walls of the a-Si film layer 1220c and the n+a-Si film layer 1230c, and parts of the upper surface of the passivation layer 1400. In addition, there is a channel intersecting both the a-Si film layer 1220c and the third metal layer 1500. The a-Si film layer 1220c and the n+a-Si film layer 1230c form a channel layer 1510 of the Thin Film Transistor, and the third metal layer 1500 forms the source electrode and the drain electrode of Thin Film Transistor respectively. The gate electrode 1310b, the source electrode, the drain electrode and the channel layer 1510 form the Thin Film Transistor. The a-Si film layer 1220c and the a-Si film layers 1220 and 1220b may be the same material. The n+a-Si film layer 1230c and the n+a-Si film layers 1230 and 1230b may be the same material. The passivation layer 1600 on the insulation layer 1400, the third metal layer 1500 and the channel layer 1510 covers the upper surfaces of the insulation layer 1400, the third metal layer 1500 and the channel layer 1510. In addition, the passivation layer 1600 further includes a through hole at the part covering the Thin Film Transistor. The overcoating layer 1700 on the passivation layer 1600 in the first region of the first substrate 15 covers the passivation layer 1600 at the position corresponding to the first electrode layer 1100, the photoelectric conversion layer 1200 and the second electrode layer 1310. The second transparent conductive layer 1800 covers the overcoating layer 1700. Moreover, the second transparent conductive layer 1800 further functions as a wire to electrically connect with a component. For example, in this embodiment, the second transparent conductive layer 1800 further covers a part of the passivation layer 1600 and is electrically connected with the drain electrode of the Thin Film Transistor in the second region via the through hole of the passivation layer 1600. The Al reflective layer 1900 on the second transparent conductive layer 1800 covers the second transparent conductive layer 1800 at the position corresponding to the overcoating layer 1700.

The first region 18 of the first substrate 15 described above forms a reflective region and the second region 19 of the first substrate 15 forms a transmittive region.

Referring to FIG. 2 again, the peripheral circuit 20 includes a storage 30, a controller 40 and a system power 50 which are electrically connected sequentially. The storage 30 is electrically connected to the solar battery unit 100 via a wire 60.

As shown in FIGS. 2 and 3, when the light irradiates the photoelectric conversion layer 1200 of the solar battery unit 100 through the slits 110d, the photoelectric conversion layer 1200 then generates electron-hole-pairs and electric energy is sent to the storage 30 via the wire 60, and finally to the system power 50. In FIG. 2, the storage 30, the controller 40 and the system power 50 work in a same manner as the prior art, which will not be described herein particularly.

The first substrate 15 includes a plurality of pixel regions 16 described above. Several solar battery units 100 in the pixel regions 16 are connected with one another in series to form a solar battery. In the above embodiment, both the solar battery units and the Thin Film Transistors are configured at the same side of the first substrate 15, i.e., configured between the first substrate 15 and the second substrate 17. Therefore, compared with the conventional liquid crystal display panel with a solar battery, the liquid crystal display panel of the invention is thinner and simpler.

In another embodiment of the invention, not all the pixel regions 16 have a solar battery unit. Because the structures of the solar battery units in the pixel regions 16 are the same as or similar to one another, the same solar battery unit(s) can be used for different pixel regions 16. Not all solar battery units will be listed one by one herein.

The manufacturing technology of the a-Si thin film solar battery is quite similar to that of the Thin Film Transistor in the liquid crystal display apparatus. Therefore, in the embodiment of the invention, both the solar battery and the Thin Film Transistors are configured in a pixel region of the liquid crystal display apparatus and are formed simultaneously, which simplifies the manufacturing process and reduces the cost. FIGS. 4a to 10 are schematic diagrams illustrating the manufacturing method of the first substrate according to an embodiment of the invention. Hereinafter, the manufacturing method of the first substrate according to the embodiment of the invention is described in detail with reference to FIGS. 4a to 10. FIGS. 4a, 5a, 6a, 7a, 8a and 9 are cross-section views respectively and FIGS. 4b, 5b, 6b, 7b and 8b are top plan views corresponding thereof.

Step 1: A first electrode layer is formed in a first region of the first substrate. A p+a-Si film layer is formed on the first electrode layer. The first electrode layer and the p+a-Si film layer are arranged in a comb-like shape.

Figure 4A:
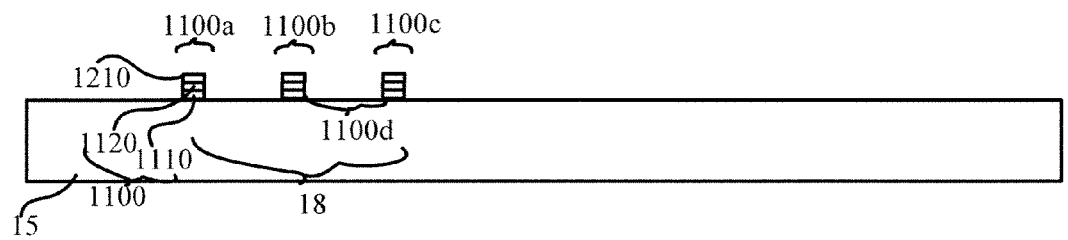
FIGS. 4a-9 are schematic diagrams illustrating a method for manufacturing a liquid crystal display panel according to an embodiment of the invention.
Figure 4B:
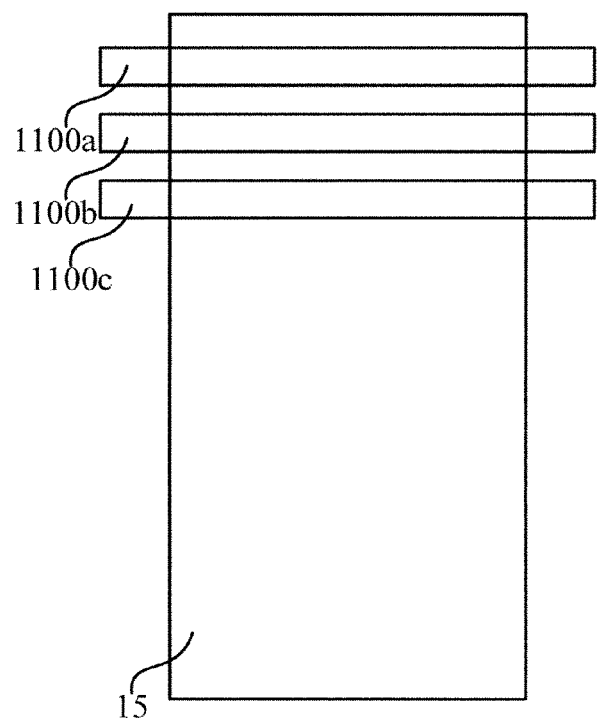

Referring to FIGS. 4a and 4b, a first metal layer 1110 and a first transparent conductive layer 1120 are deposited sequentially on the first substrate 15. The first metal layer 1110 and the first transparent conductive layer 1120 may be deposited by the conventional vapour deposition method such as the Plasma Enhanced Chemical Vapour Deposition (PECVD) method or the sputtering method.

A p+a-Si film layer 1210 is deposited on the first transparent conductive layer 1120, which may be formed by the conventional vapour deposition method such as the Plasma Enhanced Chemical Vapour Deposition (PECVD) method or the sputtering method.

Subsequently, the first metal layer 1110, the first transparent conductive layer 1120 and the p+a-Si film layer 1210 are formed in a comb-like shape shown in FIG. 4b by the conventional etching technology.

Certainly, in another embodiment, the first transparent conductive layer 1120 may be omitted, so the upper surface of the first metal layer 1110 may be covered with the p+a-Si film layer 1210 directly. The forming method in this embodiment is similar to the above embodiment and will not be described again herein.

Step 2: An a-Si film layer is formed on the p+a-Si film layer in the first region, in the gap between each other thereof, as well as in the second region of the first substrate. The a-Si film layer covers side walls of both the first electrode layer and the p+a-Si film layer. The a-Si film layer in the first region is disconnected from that in the second region.

Figure 5A:
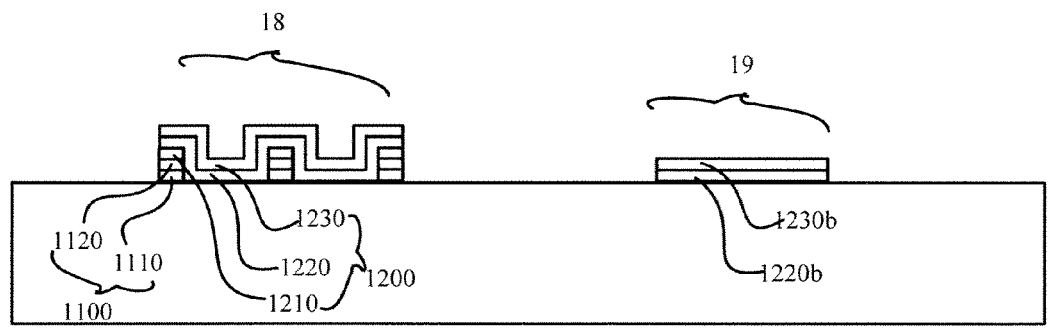
Figure 5B:
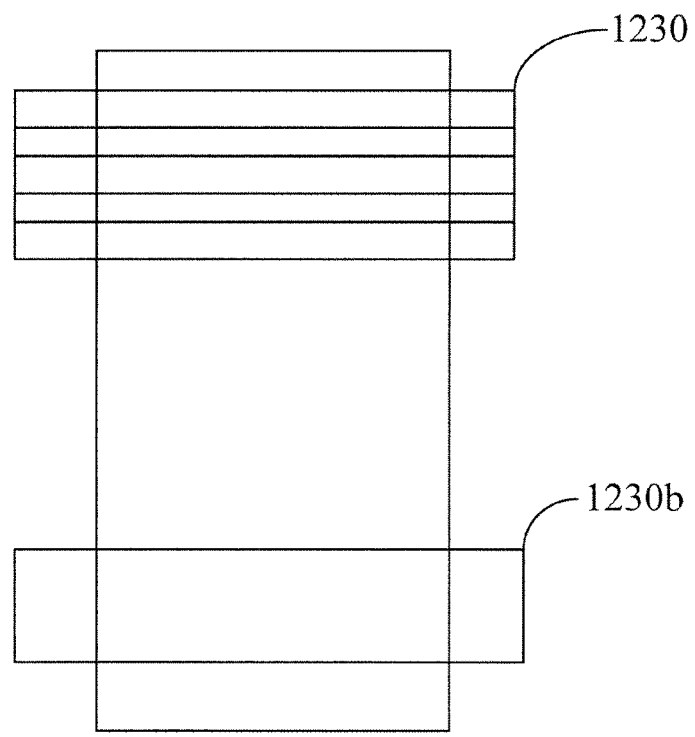

Referring to FIGS. 5a and 5b, the a-Si film layer 1220 of the first region and the a-Si film layer 1220b in the second region are formed sequentially on the first substrate by the conventional vapour deposition method such as the Plasma Enhanced Chemical Vapour Deposition (PECVD) method or the sputtering method.

In the first region 18, the a-Si film layer 1220 covers the p+a-Si film layer 1210, the side walls of laminated structures of the first electrode layer 1100 arranged in a comb-like shape, and gaps between each other thereof arranged in a comb-like shape.

Step 3: An n+a-Si film layer is formed on the a-Si film layer. The p+a-Si film layer, the a-Si film layer and the n+a-Si film layer in the first region form a photoelectric conversion layer.

Referring to FIGS. 5a and 5b, the n+a-Si film layer 1230 in the first region 18 and the n+a-Si film layer 1230b in the second region 19 are deposited sequentially on the first substrate by the conventional vapour deposition method such as the Plasma Enhanced Chemical Vapour Deposition (PECVD) method or the sputtering method. The n+a-Si film layers in the first and the second regions are located on the a-Si film layer and cover the upper surface of the a-Si film layer.

Step 4: A second metal layer is formed on the n+a-Si film layer. The second metal layer in the first region forms a second electrode layer and the second metal layer in the second region forms a gate electrode.

Figure 6A:
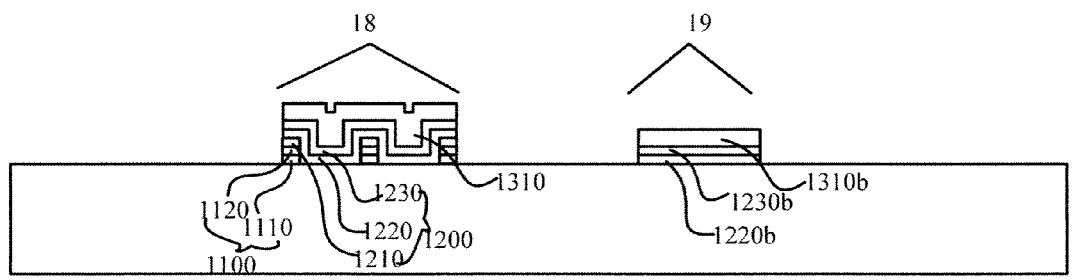
Figure 6B:
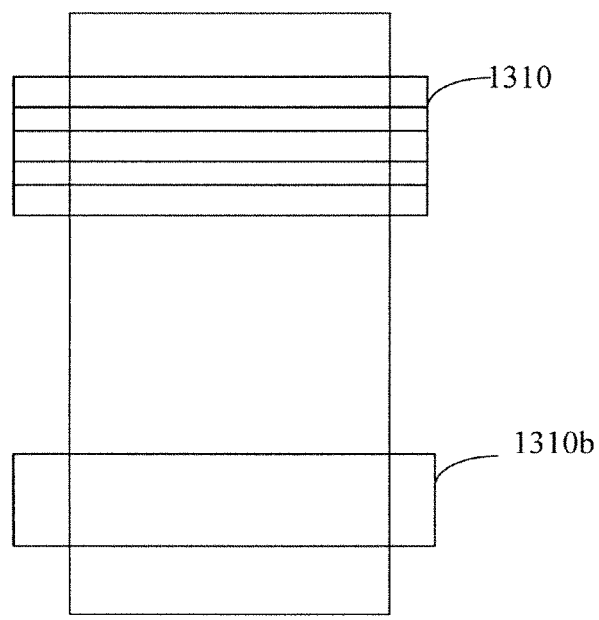

Referring to FIGS. 6a and 6b, the second metal layer includes the second metal layer 1310 in the first region 18 and the second metal layer 1310b in the second region 19. The second metal layer 1310 in the first region 18 covers the upper surface of the n+a-Si film layer 1230, and the second metal layer 1310b in the second region 19 covers the upper surface of the n+a-Si film layer 1230b. The second metal layer in the first and the second regions may be deposited by the conventional vapour deposition method such as the Plasma Enhanced Chemical Vapour Deposition (PECVD) method or the sputtering method. The second metal layer 1310 or 1310b may be Al, Ag, Cu, Mo, or other metals or alloys, e.g., AlNd in this embodiment.

The p+a-Si film layer 1210 in a comb-like shape formed in Step 1, the a-Si film layer 1220 and the n+a-Si film layer 1230 in the first region overlapping form the photoelectric conversion layer 1200 of the solar battery unit and the second metal layer 1310 on the photoelectric conversion layer 1200 forms the second electrode layer of the solar battery unit. The second metal layer 1310b in the second region forms the gate electrode of the Thin Film Transistor.

Step 5: A continuous insulation layer is formed on the second metal layer and in gaps between the first and the second regions.

Figure 7A:
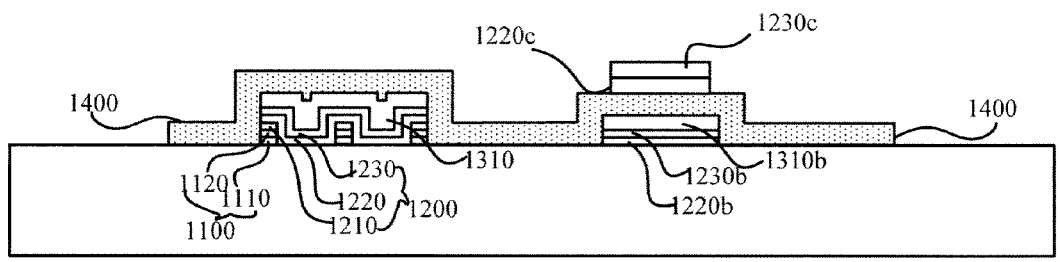
Figure 7B:
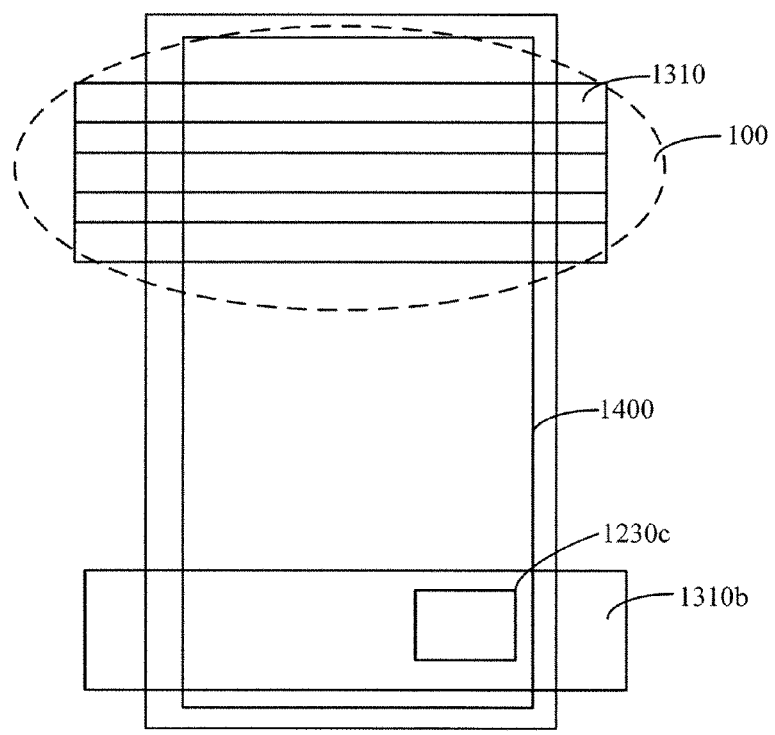

Referring to FIGS. 7a and 7b, the insulation layer 1400 covers the second metal layer 1310 and 1310b as well as gaps between the first and the second regions. The insulation layer 1400 may be deposited by the conventional vapour deposition method such as the Plasma Enhanced Chemical Vapour Deposition (PECVD) method or the sputtering method.

Step 6: The source electrode, the drain electrode, and the channel layer intersecting the source electrode and the drain electrode are formed on the insulation layer corresponding to the gate electrode.

Figure 8A:
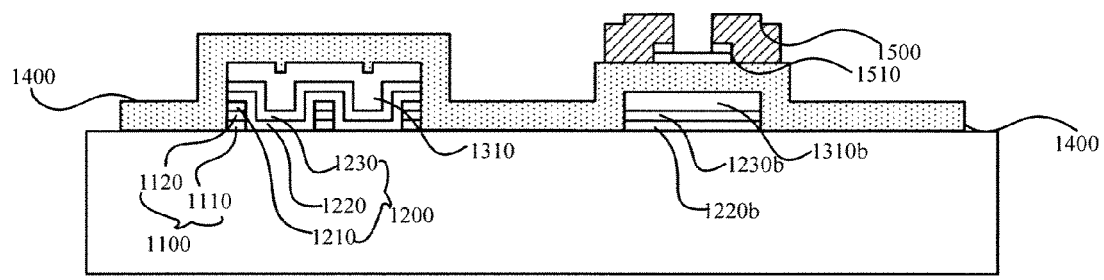
Figure 8B:
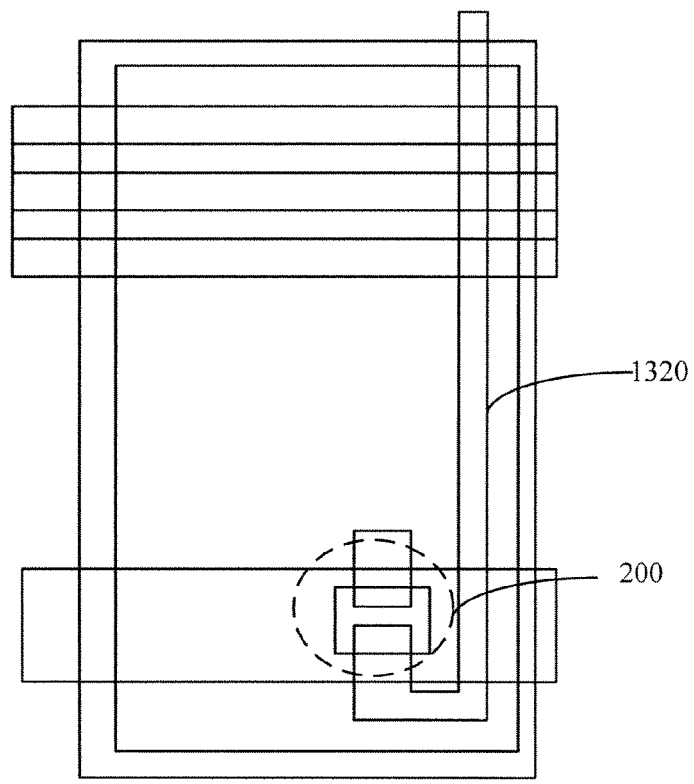

Referring to FIGS. 8a and 8b, the channel layer 1510 is formed on the insulation layer 1400 corresponding to the gate electrode. The a-Si film layer and the n+a-Si film layer on the a-Si film layer are formed by the conventional vapour deposition method such as the Plasma Enhanced Chemical Vapour Deposition (PECVD) method or the sputtering method.

A third metal layer 1500 is formed in parts of the region corresponding to the gate electrode, and covers the opposite edges of the channel layer 1510. The third metal layer 1500 is also deposited on the channel layer 1510 and the insulation layer 1400 by the conventional vapour deposition method such as the sputtering method, and it may be Cr or MoAlMo. The third metal layer 1500 in the second region is formed by a wet etching method. Thereafter, a channel intersected the third metal layer 1500 and the channel layer 1510 by a dry etching method, then the source electrode, the drain electrode and the channel of the Thin Film Transistor are formed simultaneously.

In Step 6, a data line 1320 (shown in FIG. 8b) electrically connected with the source electrode may also be formed. The data line 1320 is formed according to the prior art, which will not be described again.

Step 7: A second substrate is set up opposite to the first substrate, and a liquid crystal layer is sealed between the two substrates.

Before Step 6 and after Step 5, the method further includes:

Step 51: A passivation layer is formed on the source electrode, the drain electrode, the channel layer and the insulation layer in the first region.

Figure 9:
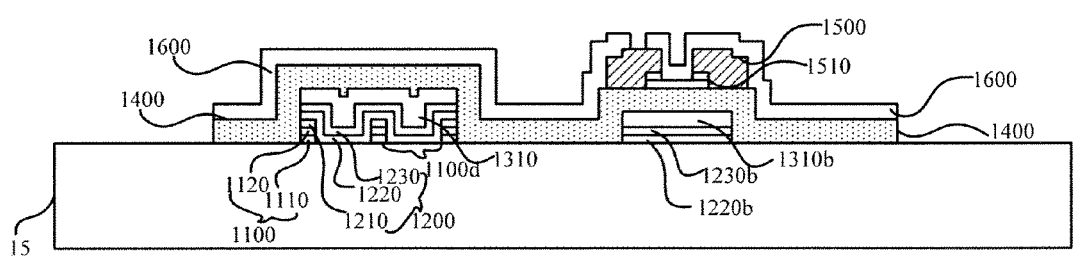
Figure 10:
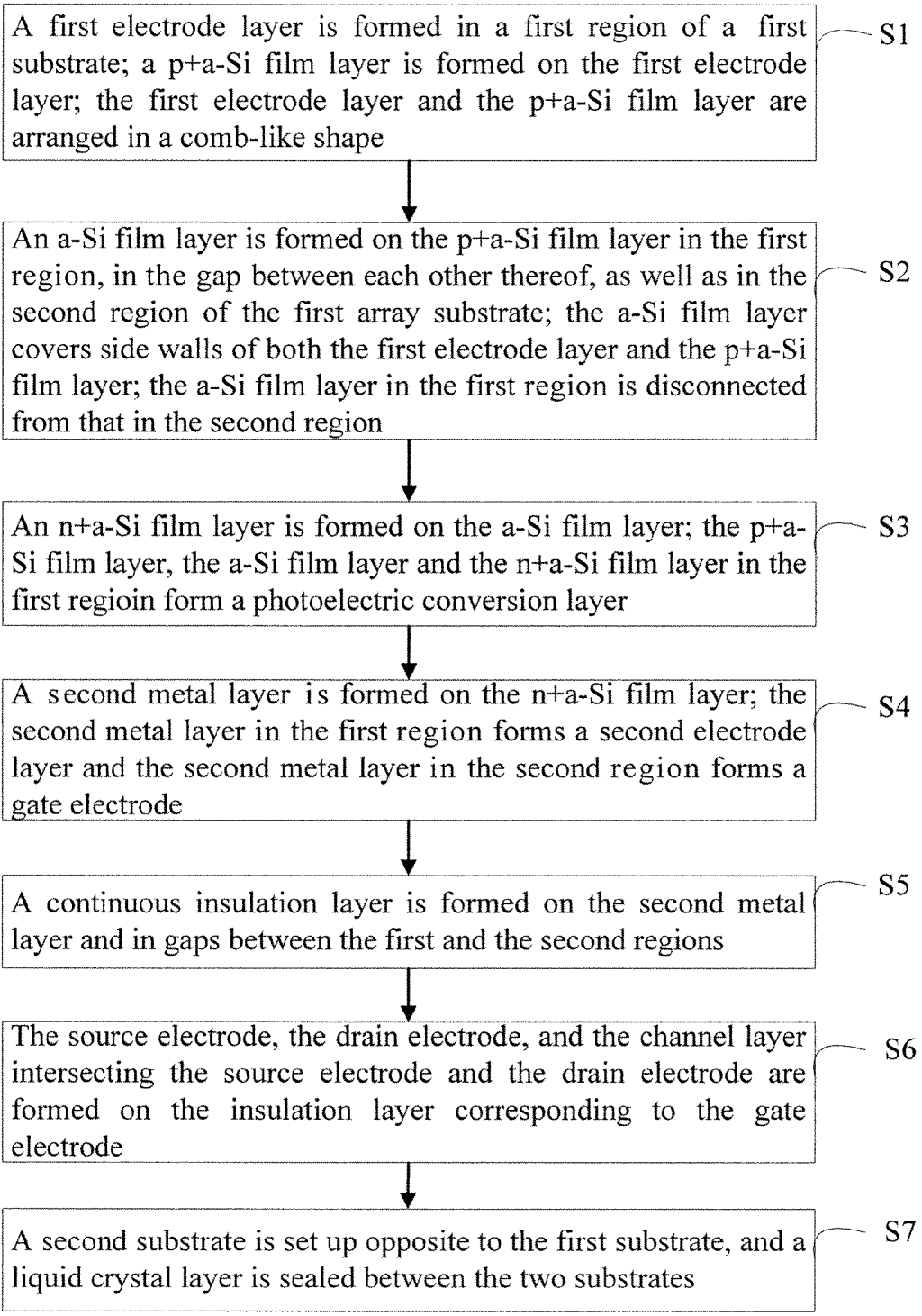
FIG. 10 is a flowchart illustrating the method for manufacturing a liquid crystal display panel according to an embodiment of the invention.

Referring to FIG. 9, the passivation layer 1600 is formed on the third metal layer 1500, the channel layer 1510 and the insulation layer 1400. The passivation layer 1600 is deposited by the conventional vapour deposition method such as the Plasma Enhanced Chemical Vapour Deposition (PECVD) method or the sputtering method. After the passivation layer 1600 is deposited, it is etched to form a through hole corresponding to the drain electrode of the Thin Film Transistor.

Step 52: The overcoating layer is formed on the passivation layer in the first region.

Referring to FIG. 3, the overcoating layer 1700 on the passivation layer 1600 in the first region covers the passivation layer 1600 corresponding to the first electrode layer 1100, the photoelectric conversion layer 1200 and the second metal layer 1310.

Step 53: A second transparent conductive layer is formed on the overcoating layer.

Referring to FIG. 3 again, the second transparent conductive layer 1800 covers the overcoating layer 1700, and further functions as a wire to electrically connect with a component.

For example, in this embodiment, the second transparent conductive layer 1800 also partially covers the passivation layer 1600 and electrically connects with the drain electrode of the Thin Film Transistor in the second region via the through hole in the passivation layer 1600.

Step 54: An Al reflective layer is formed on the second transparent conductive layer.

Referring to FIG. 3 again, the Al reflective layer 1900 on the second transparent conductive layer 1800 covers the second transparent conductive layer 1800 corresponding to the overcoating layer 1700.

After the above steps, the first region 18 forms a reflective region of the transflective liquid crystal display panel and the second region 19 forms a transmittive region thereof.

The above Step 5 and Step 6, as well as Step 51 to Step 54 include conventional knowledge of the transflective liquid crystal display panel, and therefore are not disclosed.

The foregoing is only preferred embodiments of the invention. The protection scope of the invention, however, is not limited to the above description. Any change or substitution, easily occurring to those skilled in the art, without departing from the scope of the technical scheme of the invention, should be covered by the protection scope of the invention.

What is claimed is:

1. A liquid crystal display panel, comprising a first substrate and a second substrate which are opposite to each other and a liquid crystal layer between the first and second substrates;
    wherein the first substrate comprises at least two gate lines and at least two data lines; the at least two gate lines intersect with the at least two data lines respectively to form pixel regions, and each of the pixel regions has a Thin Film Transistor;
    wherein at least one of the pixel regions has a solar battery unit and the solar battery unit comprises a first electrode layer, a photoelectric conversion layer and a second electrode layer which overlap sequentially from a surface of the first substrate; and
    wherein an insulation layer, a passivation layer, an overcoating layer, a second transparent conductive layer and an Al reflective layer overlap sequentially on an upper surface of the second electrode layer of the solar battery unit.

2. The liquid crystal display panel of claim 1, wherein the first electrode layer comprises a first metal layer and a first transparent conductive layer which is on the first metal layer and covers an upper surface of the first metal layer, the first electrode layer having laminated structures being arranged in a comb-like shape.

3. The liquid crystal display panel of claim 2, wherein width of a gap between adjacent laminated structures of first electrode layer is larger than zero and smaller than 300 μm.

4. The liquid crystal display panel of claim 2, wherein the photoelectric conversion layer comprises a p+amorphous Silicon (p+a-Si) film layer, an a-Si film layer and an n+a-Si film layer which overlap sequentially;
    the p+a-Si film layer covers an upper surface of the first transparent conductive layer and is arranged in a comb-like shape;
    the a-Si film layer covers the p+a-Si film layer, the first electrode layer and the surface of the first substrate corresponding to a gap between the laminated structures of the first electrode layer; and
    the n+a-Si film layer covers an upper surface of the a-Si film layer.

5. The liquid crystal display panel of claim 4, wherein the second electrode layer comprises a second metal layer covering an upper surface of the n+a-Si film layer.

6. The liquid crystal display panel of claim 5, wherein the second metal layer and the at least two gate lines are the same material.

7. The liquid crystal display panel of claim 1, wherein the second transparent conductive layer is electrically connected with the Thin Film Transistor.

8. The liquid crystal display panel of claim 1, wherein the solar battery units in the pixel regions are connected in series.

9. A liquid crystal display apparatus, comprising opposite first and second substrates and a liquid crystal layer between the first and second substrates;
    wherein the first substrate comprises a plurality of gate lines and data lines which intersect with each other to define a plurality of pixel regions, each of the pixel regions having a Thin Film Transistor; and
    wherein at least one of the pixel regions has a solar battery unit, and the solar battery unit comprises a first electrode layer, a photoelectric conversion layer and a second electrode layer which are sequentially disposed in stack; and
    wherein an insulation layer, a passivation layer, an overcoating layer, a second transparent conductive layer and an Al reflective layer are disposed sequentially on an upper surface of the second electrode layer of the solar battery unit.

10. The liquid crystal display apparatus of claim 9, wherein the first electrode layer comprises a first metal layer and a first transparent conductive layer covering an upper surface of the first metal layer.

11. The liquid crystal display apparatus of claim 9, wherein there is a gap between laminated structures of the first electrode layer.

12. The liquid crystal display apparatus of claim 11, wherein width of the gap between the laminated structures of first electrode layers is larger than zero and smaller than 300 μm.

13. The liquid crystal display apparatus of claim 9, wherein the photoelectric conversion layer comprises a p+amorphous Silicon (p+a-Si) film layer, an a-Si film layer and an n+a-Si film layer which are sequentially disposed in stack.

14. The liquid crystal display apparatus of claim 9, further comprising a peripheral circuit electrically connected with the first electrode layer and the second electrode layer of the solar battery unit.

15. The liquid crystal display apparatus of claim 14, wherein the peripheral circuit comprises a storage, a controller and a system power which are electrically connected sequentially; and
    wherein the storage is electrically connected with the first electrode layer and the second electrode layer of the solar battery unit.

* * * * *